United States Patent [19]

Hills et al.

[11] Patent Number: 5,744,049
[45] Date of Patent: Apr. 28, 1998

[54] PLASMA REACTOR WITH ENHANCED PLASMA UNIFORMITY BY GAS ADDITION, AND METHOD OF USING SAME

[75] Inventors: Graham W. Hills, Los Gatos; Yuh-Jia Su, Cupertino, both of Calif.

[73] Assignee: Applied Materials, Inc., Santa Clara, Calif.

[21] Appl. No.: 276,750

[22] Filed: Jul. 18, 1994

[51] Int. Cl.$^6$ .................................................. H01L 21/02
[52] U.S. Cl. .................... 216/67; 156/345 P; 156/643.1; 156/646.1; 216/79
[58] Field of Search .................... 156/345 P, 643.1, 156/646.1; 216/67, 79

[56] References Cited

U.S. PATENT DOCUMENTS

| | | | |
|---|---|---|---|
| 4,207,137 | 6/1980 | Tretola | 156/643.1 |
| 4,513,021 | 4/1985 | Purdes et al. | |
| 4,784,720 | 11/1988 | Douglas | 156/643.1 |
| 4,990,229 | 2/1991 | Campbell et al. | 156/345 P |
| 5,134,965 | 8/1992 | Tokuda et al. | |
| 5,356,515 | 10/1994 | Tahara et al. | 156/643.1 |
| 5,380,397 | 1/1995 | Fukuyama et al. | 216/67 |
| 5,415,728 | 5/1995 | Hasegawa et al. | 156/643.1 |

FOREIGN PATENT DOCUMENTS 0 693 769 A2  7/1995  European Pat. Off. .

OTHER PUBLICATIONS

Research Disclosure, No. 328, 1 Aug. 1991 p. 634 XP 000217959 'Gas Supply Configuration for Dry Etching Tools for Improved Etch Uniformity'.

Primary Examiner—T. Tung
Attorney, Agent, or Firm—Michaelson & Wallace

[57] ABSTRACT

The invention improves etch uniformity across a silicon wafer surface in an RF plasma etch reactor. In a first aspect of the invention, etch uniformity is enhanced by reducing the etchant species (e.g., Chlorine) ion and radical densities near the wafer edge periphery without a concomitant reduction over the wafer center, by diluting the etchant (Chlorine) with a diluent gas which practically does not etch Silicon (e.g., Hydrogen Bromide) near the wafer edge periphery. In a second aspect of the invention, etch rate uniformity is enhanced by more rapidly disassociating Chlorine molecules over the center of the wafer to increase the local etch rate, without a concomitant hastening of Chlorine dissociation near the wafer periphery, by the introduction of an inert gas over the wafer center. In a third aspect of the invention, etch rate uniformity is enhanced by forcing gas flow from the gas distribution plate downward toward the wafer center to provide a greater concentration of Chlorine ions over the wafer center, by reducing the effective diameter of the chamber between the gas distribution plate and the wafer to approximately the diameter of the wafer. In a fourth aspect of the invention, etch rate uniformity is enhanced by reducing RF power near the wafer edge periphery, by reducing the RF pedestal to a diameter substantially less than that of the wafer.

25 Claims, 7 Drawing Sheets

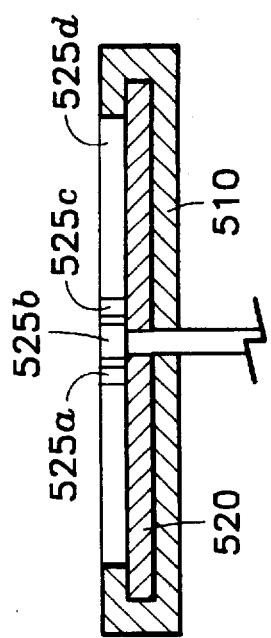
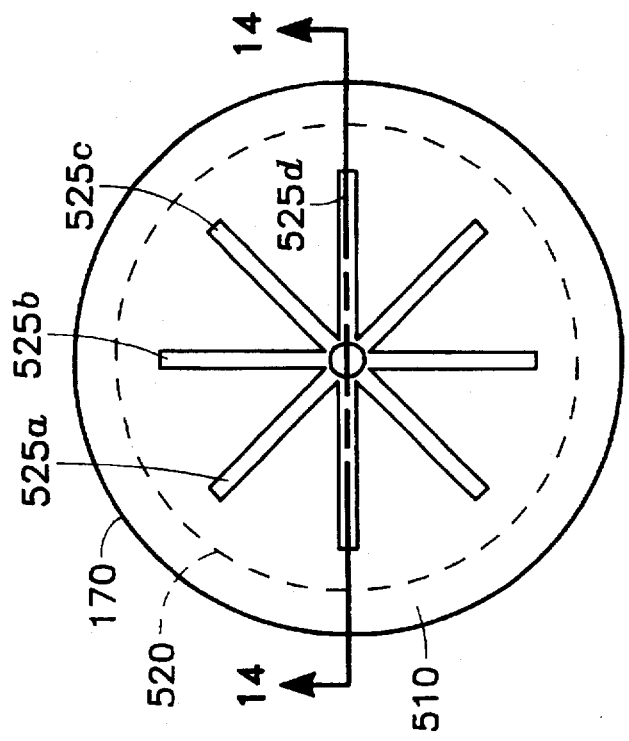
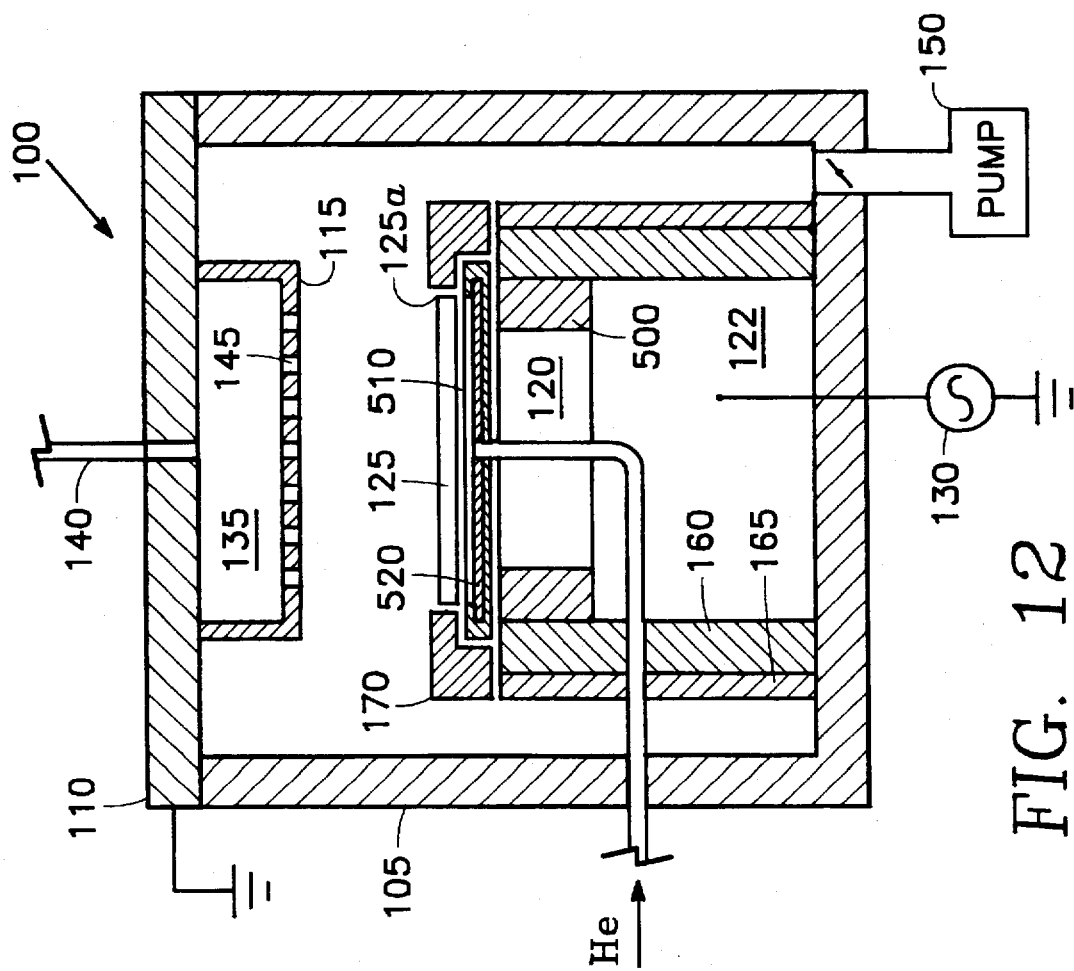
FIG. 14
FIG. 15
FIG. 12

5,744,049

PLASMA REACTOR WITH ENHANCED PLASMA UNIFORMITY BY GAS ADDITION, AND METHOD OF USING SAME

BACKGROUND OF THE INVENTION

1. Technical Field

The invention is related to RF plasma reactors for processing semiconductor wafers and particularly to improvements therein for increasing the uniformity of plasma ion density across the surface of the semiconductor wafer.

2. Background Art

RF plasma reactors used for semiconductor wafer processing have many applications, including reactive ion etching, sputter etching and chemical vapor deposition, for example. Referring to FIG. 1, an RF plasma reactor specifically designed for reactive ion etching of semiconductor wafers can include a vacuum chamber 100 having a cylindrical side wall 105 and a ceiling 110 supporting a gas distribution plate 115 at the top of the chamber and a conductive wafer pedestal 120 over a base 122 supporting a semiconductor wafer 125 near the middle of the chamber 100, the pedestal 120 being coupled to an RF source 130 through the base 122 to provide the RF energy for the plasma. The gas distribution plate 115 underlies a gas manifold 135 into which gases are introduced through a gas inlet 140. Holes 145 in the bottom of the gas distribution plate 115 distribute gases from the manifold 135 into the interior of the chamber 100, which are ionized by the RF energy from the source 130 to produce the plasma. The ions or radicals in the plasma are attracted toward the wafer 125 by the RF power applied to the wafer pedestal 120. A vacuum pump 150 at the bottom of the chamber 100 removes etchant gases and reactants from the chamber and maintains a desired pressure level therein. An insulator pipe 160 and a conductive outer pipe 165 cover the sides of the wafer pedestal 120 and base 122 while an insulator ring 170 surrounds the edge periphery of the wafer 125.

Etching of Silicon surfaces on the wafer 125 can be accomplished by supplying a mixture of Chlorine (Cl) and Hydrogen Bromide (HBr) gases through the inlet 140. The Chlorine gas disassociates into Chlorine ions and radicals in the plasma which etch Silicon surfaces on the wafer while the Hydrogen Bromide provides reactants in the plasma which attack polymer deposits formed from previously deposited photoresist to regulate the etch profile. The Silicon etch rate is a direct function of the density of Chlorine ions and radicals in the plasma. The pump 150 removes volatile reactants such as Silicon-Chlorine compounds.

A fundamental problem with such a reactor is that the Chlorine ion and radical densities are much greater near the edge periphery of the wafer 125 than over the center thereof, which severely limits etch process yield and integrity. A principal reason for the greater Chlorine ion density near the wafer edge is that the vacuum pump 150 draws the gases introduced from the gas distribution plate 115 at the top of the chamber toward the side wall 105 and therefore away from the center of the chamber, thereby reducing Chlorine ion and radical densities in the region overlying the center of the wafer 125 while increasing Chlorine ion and radical densities in the region overlying the edge periphery of the wafer 125.

A conventional technique for ameliorating this problem has been to provide a vertical ring wall, sometimes referred to as a focus ring, surrounding the edge periphery of the wafer 125 in order to reduce the local Chlorine ion density at the wafer periphery, thereby providing a somewhat more uniform etch rate across the wafer surface. One problem with this approach is that the focus ring tends to trap contaminants near the wafer edge. Since such contaminants can lead to device failure, this technique can lead to a reduction in process yield.

It is a principal object of the present invention to enhance the uniformity of etch rate in an RF plasma etch reactor without requiring a focus ring.

It is a related object of the invention to enhance the uniformity of plasma ion and radical densities across the surface of a semiconductor wafer or workpiece in an RF plasma reactor.

SUMMARY OF THE DISCLOSURE

The invention is embodied in an RF plasma etch reactor for etching a semiconductor wafer having an edge periphery, the reactor including a vacuum chamber including a chamber wall and ceiling, a pedestal for holding the workpiece inside the vacuum chamber, a vacuum pump coupled to the chamber for maintaining the chamber at a predetermined operating pressure, an etchant source inlet of a gas including an etchant gas for providing a plasma species capable of etching a material on a surface of the semiconductor wafer, a gas distribution plate in the interior of the chamber connected to the etchant source inlet to distribute the etchant gas into the vacuum chamber, an RF power source for coupling RF power into the interior of the vacuum chamber to maintain a plasma therein including ions of the etchant gas and apparatus for enhancing the uniformity of etch rate.

In a first embodiment, the invention includes a diluent source inlet of a diluent gas including a species which tends to dilute the etchant species, a gas inlet array near the edge periphery of the semiconductor wafer, the gas inlet array being coupled to the diluent source inlet so as to direct the diluent gas near the edge periphery of the semiconductor wafer so as to reduce density of ions and radicals of the etchant gas near the edge periphery relative to the density of ions of the etchant gas near a center portion of the semiconductor wafer.

In a second embodiment, the invention includes a dissociating source inlet of a background gas including a species which tends to dissociate the etchant gas into the etchant species, a gas inlet array over a center portion of the semiconductor wafer, the gas inlet array being coupled to the dissociate source inlet so as to direct the dissociate diluent gas over the center of the semiconductor wafer to enhance density of the etchant species near the center portion of the wafer relative to the density of the etchant species near the edge periphery of the wafer.

In a third embodiment, the invention includes apparatus for constricting the plasma to a volume bounded near the edge periphery of the wafer from the ceiling down to within a small gap of the height of the wafer, whereby to force material of the plasma to flow close to a center portion of the wafer and thence through the gap.

In a fourth embodiment, the invention has a special pedestal for holding the wafer inside the vacuum chamber, the pedestal including a conductive inner portion having a radius less than that of the wafer and extending from a center portion of the wafer radially outward up to the radius whereby an outer portion of the wafer including an edge periphery thereof does not overlie the pedestal, the pedestal including conductive material, an RF power source connected to the pedestal for coupling RF power into the interior of the vacuum chamber to maintain a plasma therein including ions of the etchant gas, an insulating ring surrounding the pedestal and underlying the outer portion of the wafer, and an insulating layer underlying the wafer and overlying the pedestal and the insulating ring whereby to seal an interface therebetween.

BRIEF DESCRIPTION OF THE DRAWINGS

FIG. 12 is a simplified diagram of a seventh embodiment of the invention having a wafer pedestal diameter less than the wafer diameter.

FIG. 14 is an enlarged side cross-sectional view of the wafer pedestal in FIG. 12, showing how an electrostatic chuck is implemented in the embodiment of FIG. 12.

FIG. 15 is a top view corresponding to FIG. 14.

DETAILED DESCRIPTION OF THE INVENTION

Introduction

In accordance with a first aspect of the invention, etch uniformity is enhanced by reducing the etchant species (e.g., Chlorine) ion and radical densities near the wafer edge periphery without a concomitant reduction over the wafer center. This is accomplished by diluting the etchant (Chlorine) with a diluent gas which practically does not etch Silicon (e.g., Hydrogen Bromide) near the wafer edge periphery. This aspect is reflected in the embodiments of FIGS. 1, 3 and 5.

In accordance with a second aspect of the invention, etch rate uniformity is enhanced by more rapidly disassociating Chlorine molecules over the center of the wafer to increase the local etch rate, without a concomitant hastening of Chlorine dissociation near the wafer periphery. This is accomplished by the introduction of an inert gas over the wafer center. This aspect is reflected in the embodiments of FIGS. 7 and 9.

In accordance with a third aspect of the invention, etch rate uniformity is enhanced by forcing gas flow from the gas distribution plate downward toward the wafer center to provide a greater concentration of Chlorine ions over the wafer center. This is accomplished by reducing the effective diameter of the chamber between the gas distribution plate and the wafer to approximately the diameter of the wafer. This aspect is reflected in the embodiment of FIG. 11.

In accordance with a fourth aspect of the invention, etch rate uniformity is enhanced by reducing RF power near the wafer edge periphery. This is accomplished by reducing the RF pedestal to a diameter substantially less than that of the wafer. This aspect is reflected in the embodiment of FIG. 12.

Introducing a Diluent Gas Near the Wafer Periphery

Figure 2:
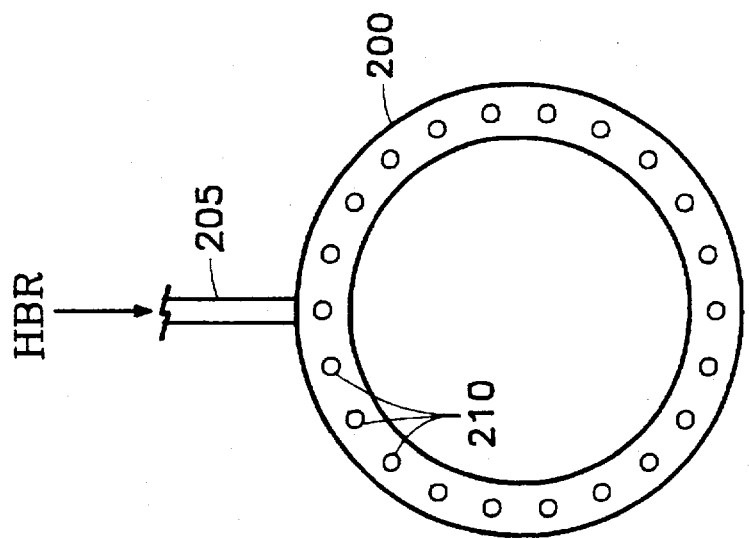
FIG. 2 is a bottom view of the hoop-shaped gas distribution ring employed in the embodiment of FIG. 1.
Figure 1:
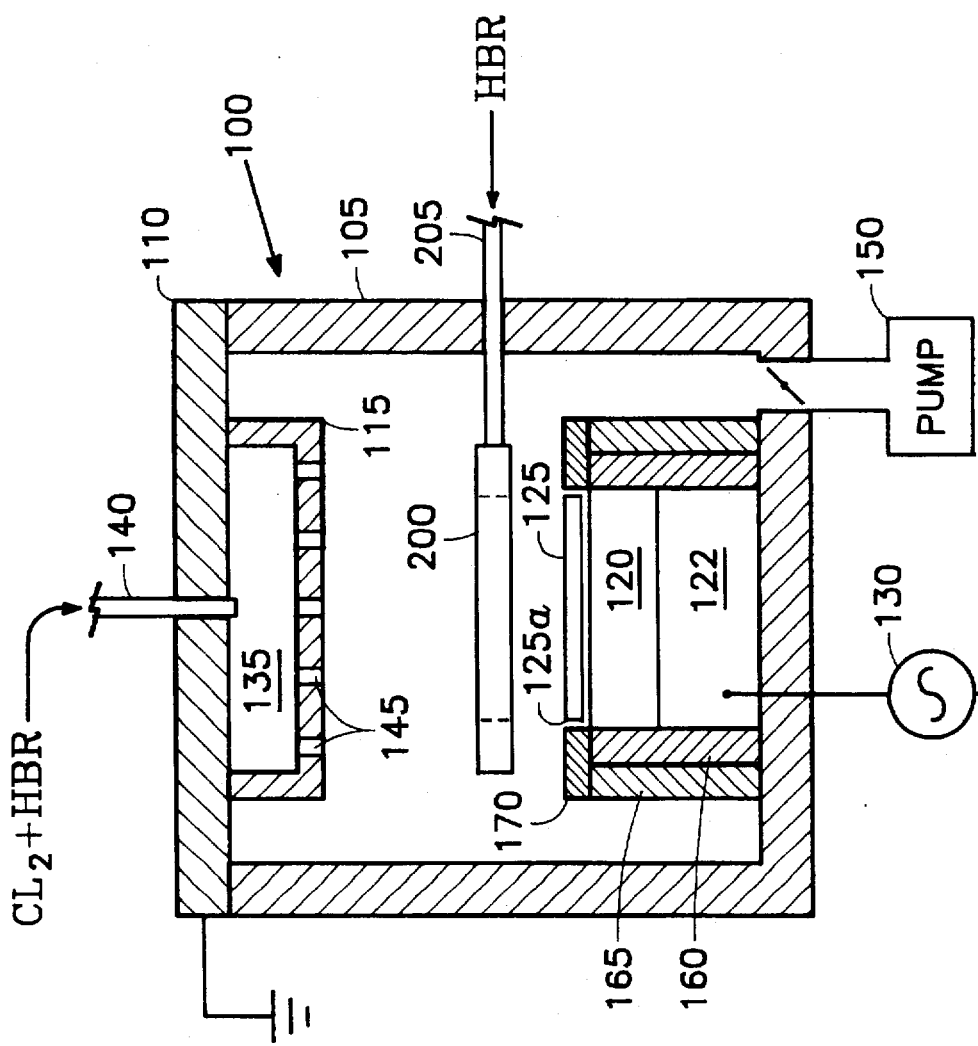
FIG. 1 is a simplified diagram of an RF plasma reactor in accordance with a first embodiment of the invention including a hoop-shaped gas distribution ring over the wafer edge periphery.

Referring now to FIG. 1, the Chlorine ion and radical densities are reduced near the wafer edge periphery by providing a hoop-shaped hollow gas distribution ring 200 overlying the edge periphery 125a of the wafer 125 and supplying a gas, such as Hydrogen Bromide which practically does not etch Silicon, to the hoop-shaped gas distribution ring 200 through a hollow inlet tube 205. The gas distribution ring 200 has downwardly facing gas outlet holes 210 best shown in FIG. 2. While the gas distribution plate 115 distributes the Chlorine/Hydrogen Bromide gas mixture throughout the chamber 100, the gas distribution ring 200 injects only Hydrogen Bromide gas over the wafer periphery 125a which depletes or dilutes the Chlorine ion and radical concentrations at the wafer periphery 125a. This reduces the etch rate near the wafer periphery 125a, making it closer to the etch near the wafer center in order to provide a more uniform etch rate across the wafer surface. In order to avoid diluting the Chlorine concentration at the wafer center, the holes 210 in the gas distribution ring may face downward at a slight angle away from the center of the chamber 100.

Figures 3, 4:
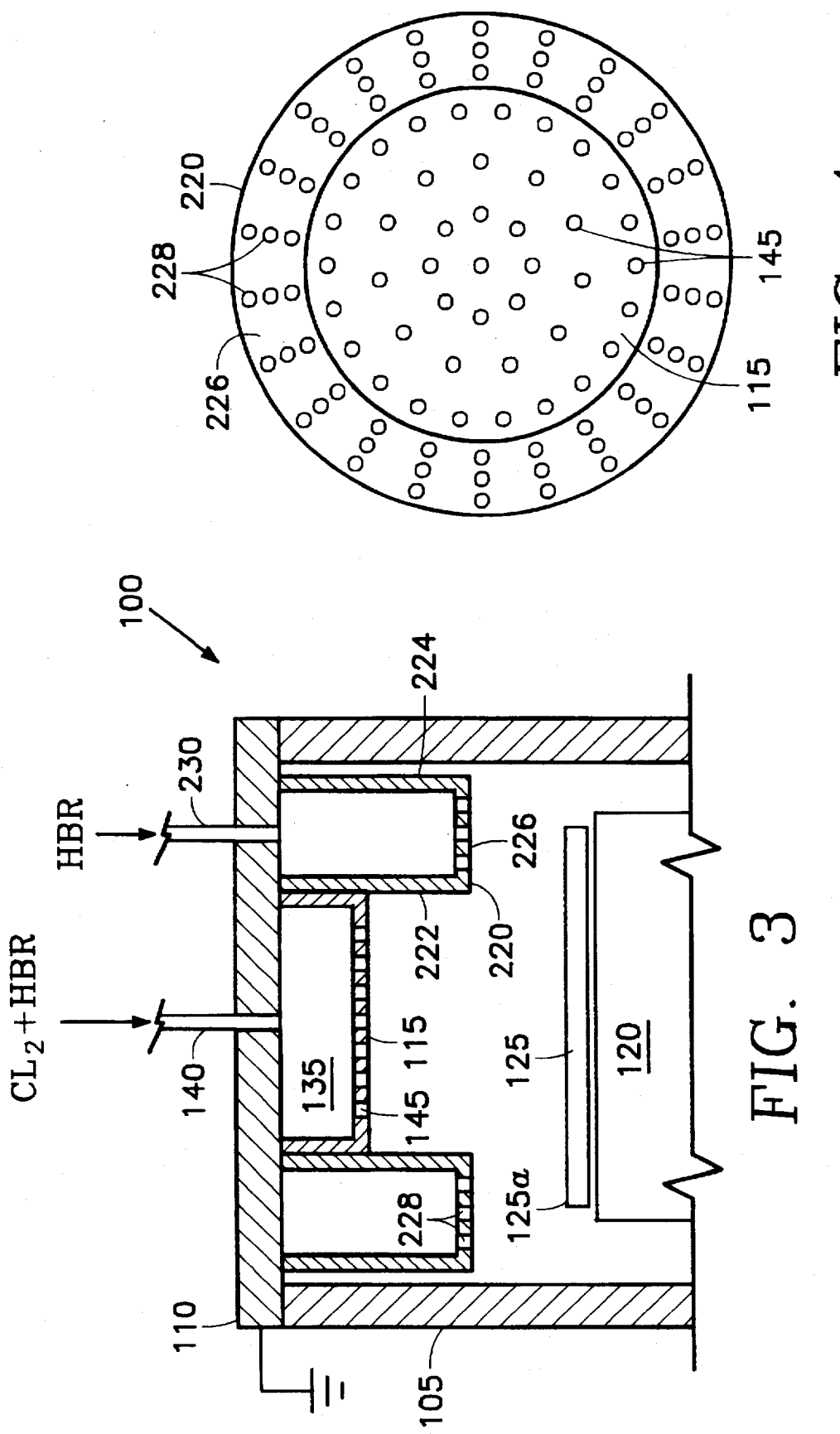
FIG. 3 is a simplified diagram of an RF plasma reactor in accordance with a second embodiment of the invention including an annular gas distribution ring surrounding the gas distribution plate.
FIG. 4 is a bottom view of the gas distribution plate and annular gas distribution ring of the embodiment of FIG. 3.

Referring now to FIG. 3, the non-etching gas (Hydrogen Bromide) may be introduced over the wafer edge periphery 125a by means of a gas distribution box ring 220 surrounding the gas distribution plate 115. The gas distribution box ring 220 has inner and outer cylindrical walls 222, 224 and a bottom plate 226 having gas outlet holes 228 therein facing the wafer edge periphery 125a. The outlet holes 228 are best shown in FIG. 4. A gas inlet 230 supplies the non-etchant gas (Hydrogen Bromide) to the gas distribution box ring 200. The pure Hydrogen Bromide travels from the outlet holes 226 into the region over the wafer edge periphery 125a to dilute the local Chlorine concentration in the wafer periphery neighborhood without a substantial amount of the pure Hydrogen Bromide reaching the region overlying the wafer center. The pure Hydrogen Bromide does not significantly reduce Chlorine concentration near the wafer center because the vacuum pump 150 draws the pure Hydrogen Bromide from the gas distribution box ring away from the wafer center and toward the chamber side wall 105, so that very little if any of the pure Hydrogen Bromide ever reaches center region. As a result, Chlorine concentration near the wafer center remains virtually unchanged while at the wafer periphery it is significantly reduced. This enhances etch rate uniformity by reducing the etch rate at the wafer periphery.

Figure 6:
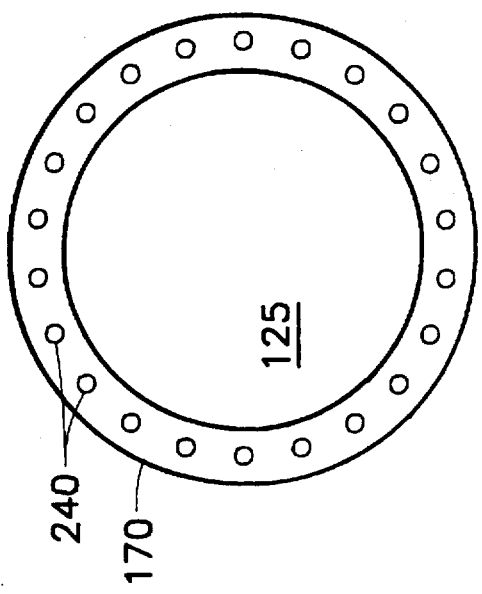
FIG. 6 is a top view of the wafer pedestal holding a wafer of the embodiment of FIG. 5.
Figure 5:
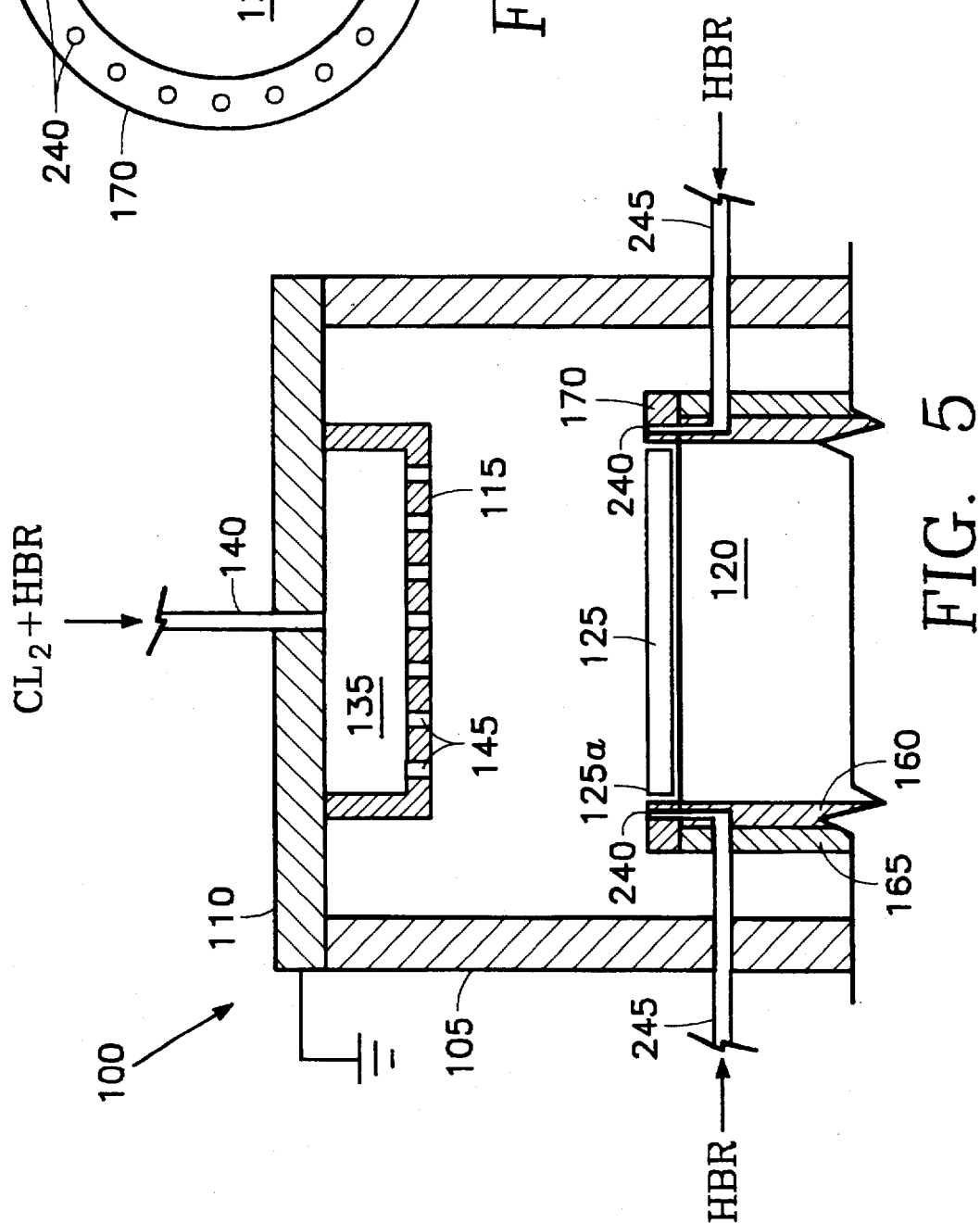
FIG. 5 is a simplified diagram of an RF plasma reactor in accordance with a third embodiment of the invention including gas distribution inlets in the wafer pedestal.

Referring now to FIG. 5, the diluent gas (e.g., Hydrogen Bromide) is introduced over the wafer edge periphery 125a through gas outlet holes 240 in the top surface of the wafer pedestal insulating ring 170 around the wafer periphery 125a. The outlet holes 240 are best shown in FIG. 6. Gas inlets 245 supply the diluent gas to the outlet holes 240. The introduction of pure Hydrogen Bromide improves the etch rate uniformity across the surface of the wafer 125 in the manner described above.

Introducing a Dissociation Agent Near the Wafer Center

Figure 8:
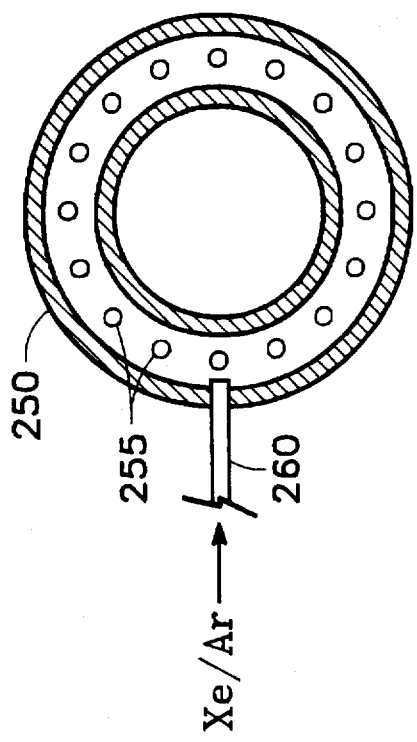
FIG. 8 is a top cross-sectional view of the hoop-shaped gas distribution ring employed in the embodiment of FIG. 7 taken along lines 8—8 of FIG. 7.
Figure 7:
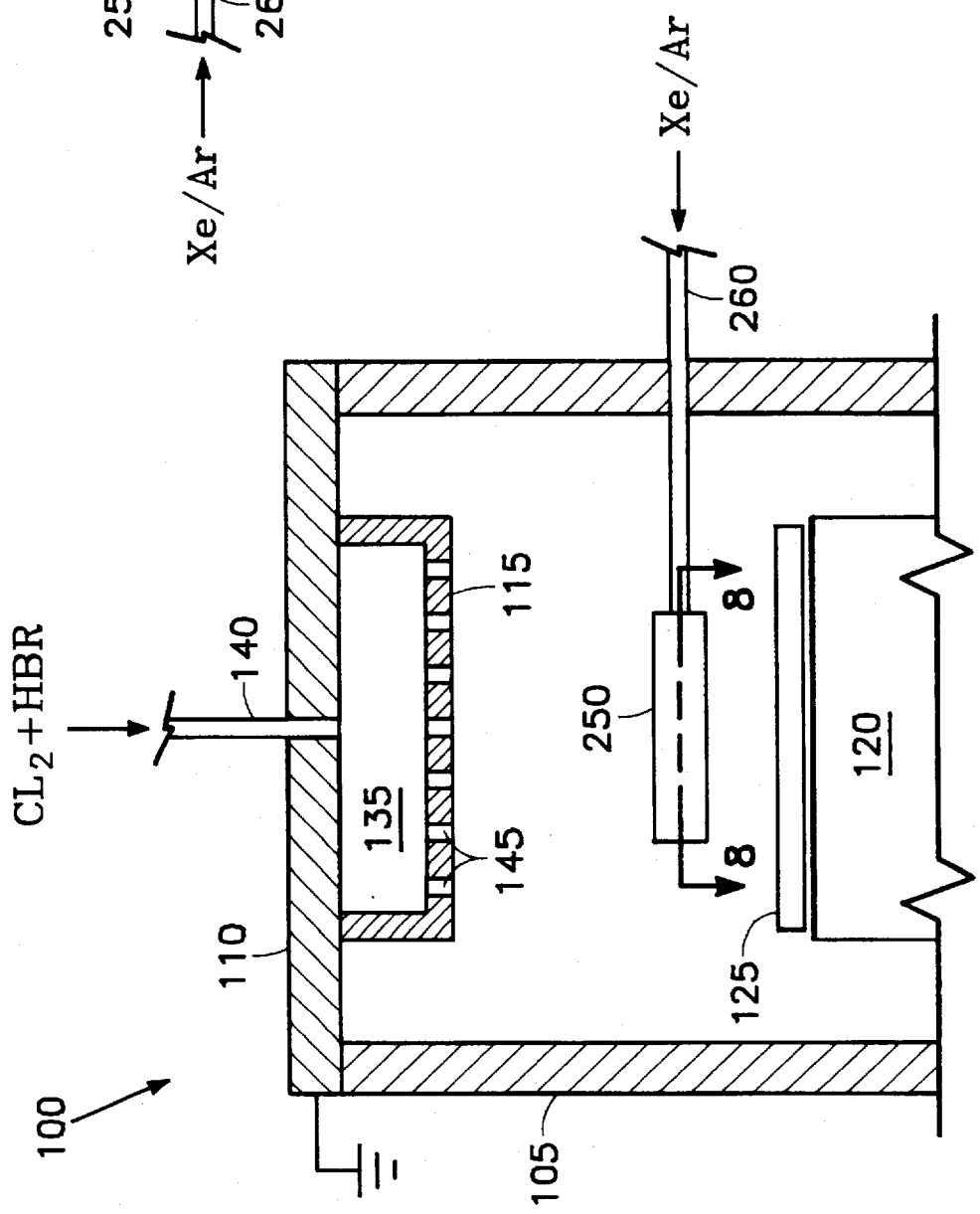
FIG. 7 is a simplified diagram of an RF plasma reactor in accordance with a fourth embodiment of the invention including a hoop-shaped gas distribution ring over the wafer center.

Etch rate near the wafer center may be increased by introducing an inert gas such as Xenon or Argon over the wafer center. Such an inert gas serves as a background gas providing collision centers for Chlorine molecules, each collision center dissociating Chlorine molecules which collide with it. The presence of such collision centers more rapidly dissociates the Chlorine molecules, thereby increasing the local Chlorine ion concentration (i.e., the Chlorine ion and radical concentrations over wafer center). In the embodiment of FIG. 7, this is accomplished by providing a small hoop-shaped gas distribution ring 250 having a diameter smaller than the wafer and having axially directed gas outlet holes 255 (best shown in FIG. 8) facing the center region of the chamber 100 overlying the wafer center. By introducing an inert gas such as Xenon, for example, through an inlet tube 260, Xenon gas passes through the holes 225 toward the chamber center and accumulates over the wafer center so that Chlorine molecule dissociation rate increases at the wafer center. This increases Chlorine ion concentration—and therefore etch rate—over the wafer center.

Figure 10:
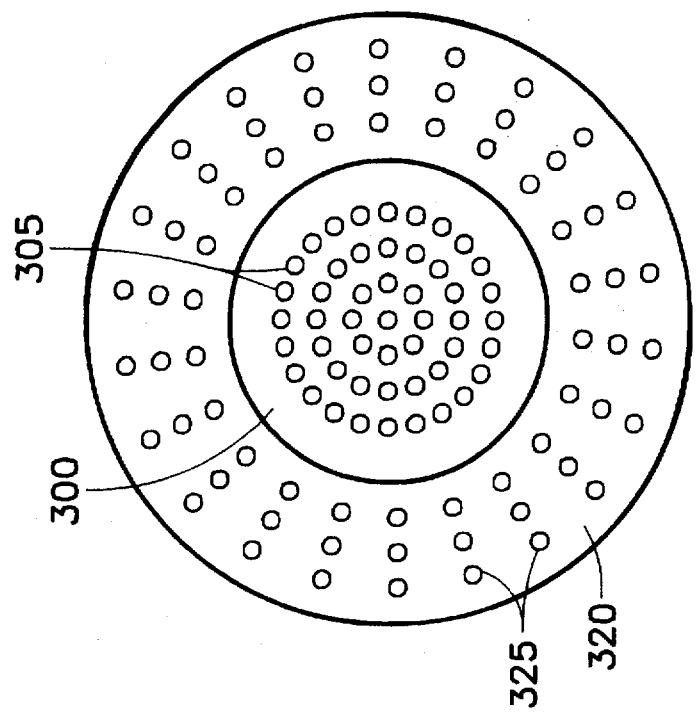
FIG. 10 is a bottom view of the gas distribution plate and annular gas distribution ring of the embodiment of FIG. 9.
Figure 9:
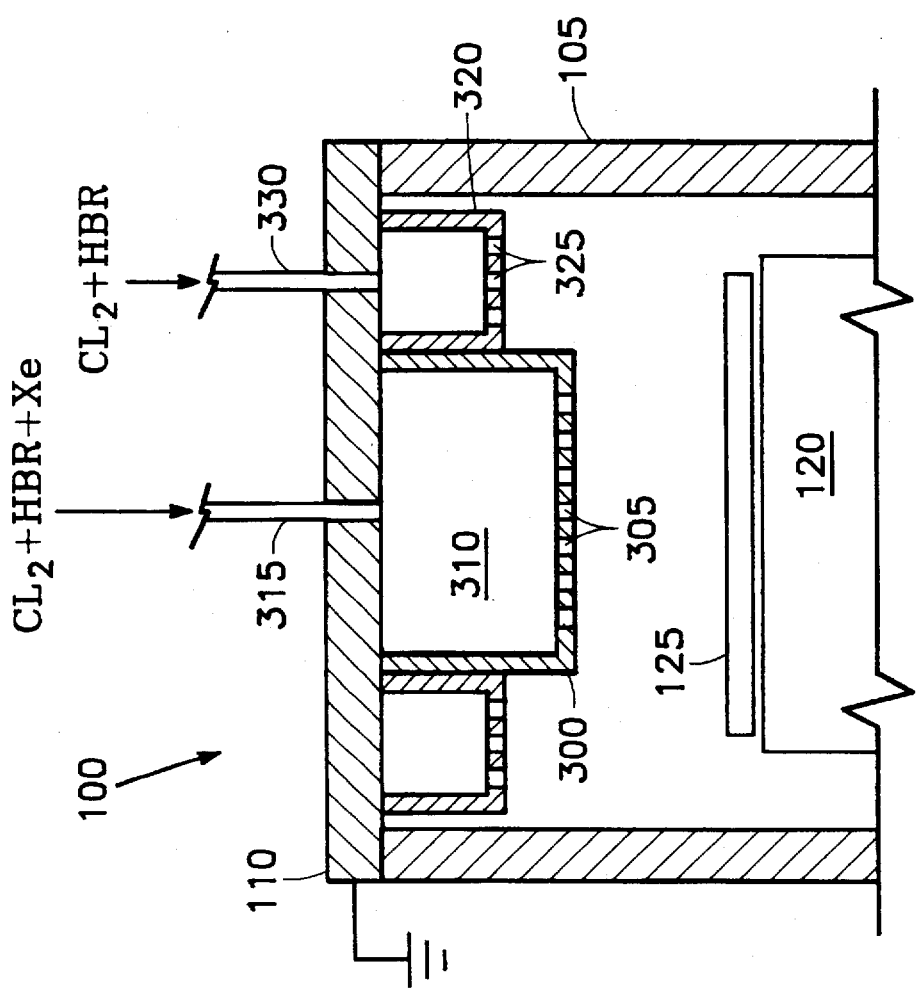
FIG. 9 is a simplified diagram of an RF plasma reactor in accordance with a fifth embodiment of the invention including an annular gas distribution ring surrounding the gas distribution plate.

Referring to FIG. 9, a background gas such as Argon or Xenon is introduced over the wafer center by a gas distribution plate 300 having gas outlet holes 305 facing the wafer center and underlying a gas manifold 310. A mixture of Chlorine, Hydrogen Bromide and Xenon is supplied to the manifold 310 through an inlet 315. The bottom of the gas distribution plate 300 is relatively close to the wafer 125. Surrounding the gas distribution plate 300 is a gas distribution box ring 320 having gas outlet holes 325 facing the middle and peripheral portions of the wafer 125. Only Chlorine and Hydrogen Bromide is supplied to the gas distribution box ring 320 (through an inlet 330), so that only the region over the center of the wafer (i.e., the region underlying the gas distribution plate 300) receives the Xenon. The gas outlet holes 305, 325 are best shown in FIG. 10. With the Xenon concentrated at the wafer center, the etch rate at the wafer center is increased, thereby removing at least some of the disparity in etch rate between the center and peripheral areas of the wafer 125.

Forcing Gas Flow Toward the Wafer Center One problem that limits the etch rate at the wafer center relative to the wafer periphery is that much of the etchant gas and plasma is drawn immediately toward the chamber side wall 105 and thence down to the vacuum pump 150 instead of staying over the wafer center. Thus, the center portion of the wafer is deprived of the gas thus drawn toward the side wall 105, which suppresses the etch rate at the wafer center.

Figure 11:
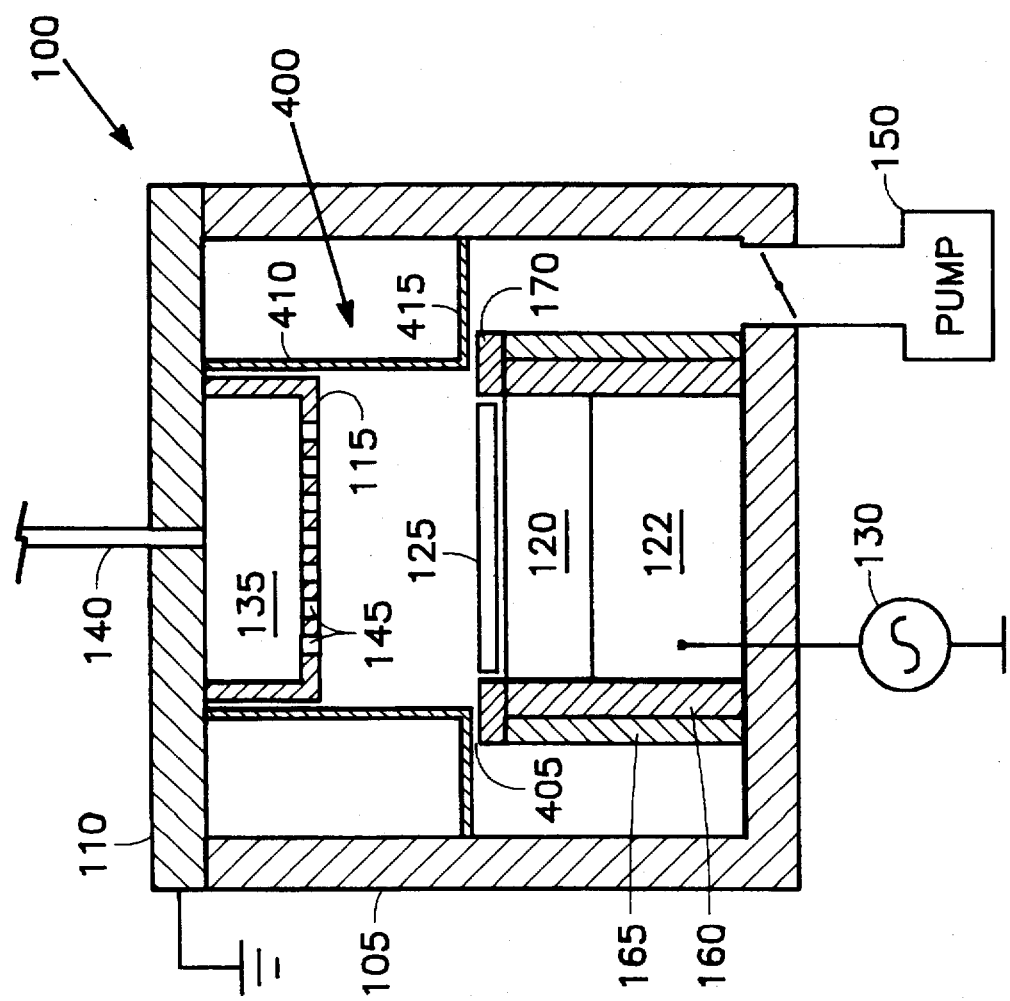
FIG. 11 is a simplified diagram of a sixth embodiment of the invention having a configurable chamber diameter.

Referring to FIG. 11, the etch rate at the wafer center is increased relative to the etch rate at the wafer periphery by providing a plasma confinement ring 400 extending from the ceiling 110 nearly down to the wafer surface, leaving a relatively small gap 405 for the plasma and gas from the gas distribution plate 115 to exit to the vacuum pump 150. The effect is to enhance gas and plasma flow down to the center of the wafer 125. This increases the amount of Chlorine ions and radicals at the wafer center. As a result, the etch rate at the wafer center is increased. In the embodiment of FIG. 11, the plasma confinement ring 400 consists of a vertical cylindrical side wall 410 extending downwardly from the ceiling 110 and terminating at the inner edge of a bottom annulus 415 whose outer edge contacts the inside surface of the cylindrical side wall 105. The gap 405 is on the order of 0.1 cm.

Reducing RF Power Near the Wafer Edge Periphery

Referring to FIG. 12, the Chlorine (etchant) ion and radical densities at the wafer periphery 125a is reduced by reducing the local plasma RF power at the wafer periphery 125a. This is accomplished by employing an RF pedestal 120 having a diameter substantially less than the diameter of the wafer 125, as shown in FIG. 12. The wafer periphery 125a, which extends out beyond the wafer pedestal 120, is supported by an insulating ring 500. This arrangement reduces the RF power in the vicinity of the wafer edge periphery 125a relative to the wafer center, which reduces the Chlorine ion concentration over the wafer periphery 125a, thereby reducing the etch rate at the wafer periphery, while the etch rate at the wafer center remains virtually the same.

Figure 13:
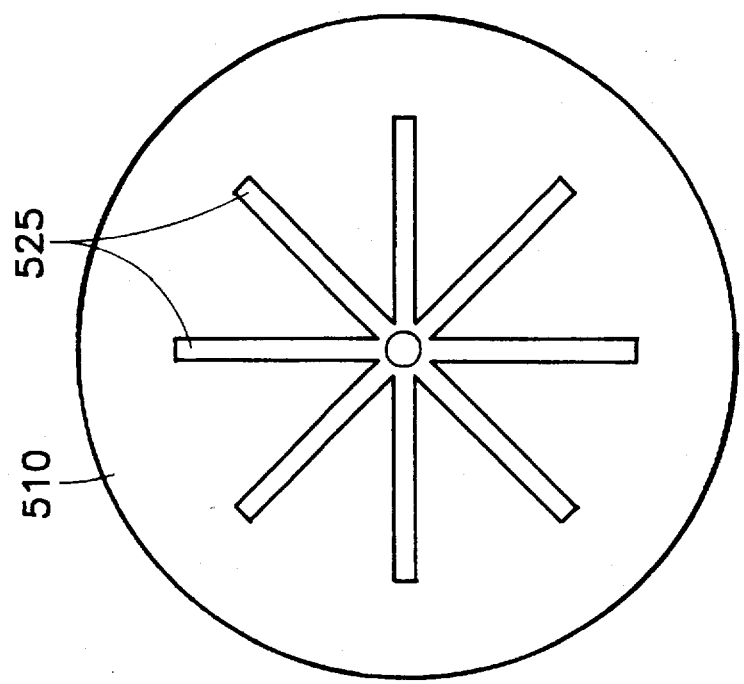
FIG. 13 is a top view of the insulating top layer in FIG. 12 showing the coolant gas grooves therein.

A problem with this arrangement is that the plasma in the chamber 100 can penetrate through the interface or gap between the conductive wafer pedestal 120 and the insulating ring 500. In order to prevent such penetration, an insulating layer 510 is provided covering both the wafer pedestal 120 and the insulating ring 500. The insulating layer 510 is preferably polyimide. In accordance with one embodiment of the invention, the polyimide insulating layer 510 constitutes an electrostatic chuck for holding the wafer 125 in place by electrostatic force using a suitable voltage applied to a conductive layer 520 inside the insulating layer 510. As shown in FIGS. 13, 14 and 15, coolant gas passages 525 (525a, 525b, 525c, 525d) in the surface of the polyimide insulating layer 510 permit a coolant gas such as helium from a coolant gas inlet 530 to be circulated beneath the wafer 125 to regulate its temperature. In order to be protected from the plasma, the conductive layer 520 is completely sealed inside the polyimide insulating layer 510, the diameter of the conducting layer 520 being about 4 mm less than that of the insulating layer 510.

Generally, in each of the foregoing embodiments, the reactor chamber including the cylindrical side wall 105 is preferably quartz or anodized Aluminum, while the ceiling 110 is anodized Aluminum. The pedestal 120 is also Aluminum while the insulating pipe 160 is quartz and the conducting pipe 165 is anodized Aluminum. The hoop-shaped gas distribution rings 200 (of FIG. 1) and 250 (of FIG. 7) are anodized Aluminum. The gas distribution plate 115 (of FIG. 1) and 300 (of FIG. 9) and the gas distribution box rings 220 (of FIG. 3) and 320 (of FIG. 9) are anodized Aluminum. The plasma confinement ring 400 of FIG. 11 is preferably anodized Aluminum. For a wafer diameter of 8 inches (20 cm), the diameter of the cylindrical side wall 105 is 13 inches (33 cm), the distance between the bottom of the gas distribution plate 115 and the wafer 125 is 3 inches (7.5 cm). The plasma confinement ring 400 of FIG. 11 has an inside diameter (a reduced chamber diameter) of between 9.0 and 9.5 inches (22 cm). For an 8-inch (20 cm) diameter wafer, the diluent gas distribution ring 200 of FIG. 1 has a diameter of about 8 inches (20 cm) while the dissociate gas distribution ring 250 of FIG. 7 has a diameter on the order of between approximately one-third to one-half that of the wafer. All of the gas holes or orifices shown are each on the order of between one to several millimeters in diameter.

While the invention has been described in detail by specific reference to preferred embodiments, it is understood that variations and modifications thereof may be made without departing from the true spirit and scope of the invention.

What is claimed is:

1. An RF plasma etch reactor for etching a semiconductor wafer having an edge periphery, said reactor characterized by:

a vacuum chamber including a chamber wall and ceiling;

a pedestal for holding said semiconductor wafer inside said vacuum chamber, said semiconductor wafer having a surface comprising a material characterized by silicon;

a vacuum pump coupled to said chamber for maintaining said chamber at a predetermined operating pressure;

an etchant gas source comprising an etchant gas characterized by a mixture of chlorine gas and hydrogen bromide for providing in a plasma etchant species capable of etching the material characterized by silicon on the surface of said semiconductor wafer;

an etchant source inlet coupled to said etchant gas source;

a gas distribution plate in the interior of said chamber connected to said etchant source inlet to distribute said etchant gas into said vacuum chamber;

an RF power source for coupling RF power into the interior of said vacuum chamber to maintain a plasma therein characterized by said etchant species;

a diluent gas source containing a diluent gas characterized by hydrogen bromide which tends to dilute said etchant species;

a diluent source inlet coupled to said diluent gas source;

a secondary gas inlet near said edge periphery of said semiconductor wafer, said secondary gas inlet being coupled to said diluent source inlet so as to direct said diluent gas near said edge periphery of said semiconductor wafer so as to reduce density of said etchant species near said edge periphery relative to the density of said etchant species near a center portion of said semiconductor wafer.

2. The reactor of claim 1 wherein said secondary gas inlet is characterized by a hoop-shaped gas distribution ring characterized by a hollow annular ring suspended in said chamber over said edge periphery of said wafer and having gas outlet holes therein.

3. The reactor of claim 1 wherein said secondary gas inlet is characterized by a gas distribution annular box ring extending from said ceiling toward said wafer and having a diameter corresponding to a diameter of said edge periphery of said wafer and a surface thereof near said edge periphery of said wafer having gas outlet holes.

4. The reactor of claim 3 wherein said diluent source inlet is characterized by a gas inlet line passing through said ceiling of said chamber and coupled to an interior cavity formed between said gas distribution box ring and said ceiling.

5. The reactor of claim 4 wherein said gas distribution plate is characterized by a vertical ring wall on an interior surface of said ceiling and a plate on a bottom edge of said vertical ring wall, said plate having gas outlet holes therethrough, said etchant source inlet characterized by a gas inlet tube coupled to a cavity formed between said gas distribution plate and said ceiling.

6. The reactor of claim 5 wherein said vertical ring wall is concentric with said annular ring.

7. The reactor of claim 1 wherein said secondary gas inlet is characterized by an array of gas outlet holes in a top surface of said wafer pedestal and arranged in an arcuate path adjacent said edge periphery of said wafer.

8. The reactor of claim 7 wherein said diluent source inlet is characterized by a gas inlet passage through said wafer pedestal coupled to said gas outlet holes in said wafer pedestal.

9. An RF plasma etch reactor for etching a semiconductor wafer having an edge periphery, said reactor characterized by:

a vacuum chamber including a chamber wall and ceiling;

a pedestal for holding said wafer inside said vacuum chamber;

a vacuum pump coupled to said chamber for maintaining said chamber at a predetermined operating pressure;

an etchant source inlet for a gas characterized by an etchant gas for providing in a plasma, species capable of etching a material on a surface of said semiconductor wafer;

a gas distribution plate in the interior of said chamber connected to said etchant source inlet to distribute said etchant gas into a region of said vacuum chamber overlying all of a top surface of said wafer;

an RF power source for coupling RF power into the interior of said vacuum chamber to maintain a plasma therein characterized by ions of said etchant gas;

a dissociating gas source containing a dissociating gas characterized by a species which tends to dissociate said etchant gas into said etchant species;

a dissociating source inlet coupled to said dissociating gas source;

a secondary gas inlet over a center portion of said semiconductor wafer, said secondary gas inlet being coupled to said dissociating source inlet so as to direct said dissociating gas to a region adjacent said center portion of said semiconductor wafer to enhance density of said etchant species near said center portion of said wafer relative to the density of said etchant species near said edge periphery of said wafer.

10. The reactor of claim 9 wherein said secondary gas inlet is characterized by a hoop-shaped gas distribution ring characterized by a hollow annular ring suspended in said chamber over said center portion of said wafer and having gas outlet holes therein.

11. The reactor of claim 9 wherein:

said secondary gas inlet is characterized by a center gas distribution plate extending from said ceiling toward said wafer and having a diameter less than that of said wafer and corresponding to a diameter of said center portion of said wafer, and a surface thereof near said wafer having gas outlet holes; and said gas distribution plate comprises a gas distribution box ring around said center gas distribution plate and overlying said edge periphery of said wafer.

12. The reactor of claim 11 wherein said dissociating source inlet is characterized by a gas inlet line passing through said ceiling of said chamber and coupled to an interior cavity formed between said center gas distribution plate and said ceiling.

13. The reactor of claim 12 wherein said gas distribution box ring is characterized by an vertical ring wall on an interior surface of said ceiling and a plate on a bottom edge of said vertical ring wall, said plate having gas outlet holes therethrough, said etchant source inlet characterized by a gas inlet tube coupled to a cavity formed between said gas distribution plate and said ceiling.

14. The reactor of claim 13 wherein said gas distribution box ring is concentric with said center gas distribution plate array.

15. The reactor of claim 13 wherein said material etched by said etchant gas is characterized by silicon.

16. The reactor of claim 9 wherein said etchant gas is characterized by a mixture of chlorine gas and hydrogen bromide.

17. The reactor of claim 16 wherein said dissociating gas is characterized by one of: (a) xenon, and b) argon.

18. In an rf plasma etch reactor for use with an rf power source to etch a substrate, said reactor being capable of being evacuated to a subatmospheric pressure and of being supplied with etchant gas characterized by chlorine, which upon being ionized in a plasma supplies etchant species capable of etching silicon, the combination comprising:

a conductive cathode within the reactor upon which a substrate having a surface characterized by silicon may be supported, said cathode being capable of being coupled to an rf power source to input rf power into the interior of said reactor to sustain a plasma including said etchant species;

an etchant gas source containing said etchant gas characterized by chlorine;

at least one primamry gas inlet spaced from the cathode for releasing into the evacuated reactor said etchant gas;

a diluent gas source containing a diluent gas characterized by hydrogen bromide which tends to dilute the etchant species;

and a secondary gas inlet about the periphery of the cathode and directing said diluent gas from said diluent gas source to a region adjacent the periphery of the cathode and of any overlying substrate so as to reduce the density of said etchant species near said periphery relative to the density of said etchant species adjacent the center of the cathode.

19. In an rf plasma etch reactor for use with an rf power source to etch a substrate, said reactor being capable of being evacuated to a subatmospheric pressure and of being supplied with etchant gas, which upon being ionized in a plasma supplies species capable of etching, the combination comprising:

a conductive cathode within the reactor upon which a substrate within the reactor may be supported, said cathode being capable of being coupled to an rf power source to input rf power into the interior of said reactor to sustain a plasma including ions of etchant gas;

at least one primary gas inlet spaced from the cathode for releasing gases into a region of the evacuated reactor overlying all of a top surface of said cathode or any substrate supported thereon, said gases comprising said etchant gas;

a dissociating gas source containing a dissociating gas which tends to promote dissociation of the etchant gas into etchant species, and a secondary gas inlet over a center portion of said cathode directing said dissociation gas from said dissociation gas source to a region adjacent said center portion of said cathode and of any overlying substrate to enhance the density of the etchant species adjacent said center portion relative to the density near the periphery.

20. The combination of claim 19 in which said dissociation gas includes at least one of xenon and argon, and said etchant gas is characterized by a mixture of chlorine and hydrogen bromide.

21. A method of etching a semiconductor wafer having an edge periphery with a RF plasma etch reactor, wherein the semiconductor wafer has a surface comprising a material characterized by silicon and the RF plasma etch reactor has a vacuum chamber, a pedestal for holding said wafer inside said vacuum chamber, and an RF poser source, said method comprising the steps of:

introducing an etchant gas characterized by a mixture of chlorine gas and hydrogen bromide for providing in a plasma, etchant species capable of etching the material characterized by silicon on the surface of said semiconductor wafer;

coupling RF poser into the interior of said vacuum chamber to maintain a plasma therein characterized by said etchant species; and introducing a diluent gas characterized by hydrogen bromide which tends to dilute said etchant species, said diluent gas being directed near said edge periphery of said semiconductor wafer so as to reduce density of said etchant species near said edge periphery relative to the density of said etchant species near a center portion of said semiconductor wafer.

22. A method of etching a semiconductor wafer having an edge periphery with a RF plasma etch reactor having a vacuum chamber, a pedestal for holding said wafer inside said vacuum chamber, and an RF power source, said method comprising the steps of:

introducing a gas characterized by an etchant gas for providing, in a plasma, species capable of etching a material on a surface of said semiconductor wafer, said gas being distributed into a region of said vacuum chamber overlying all of a top surface of said wafer;

coupling RF power into the interior of said vacuum chamber to maintain a plasma therein characterized by ions of said etchant gas; and introducing a dissociating gas characterized by a species which tends to dissociate said etchant gas into said etchant species, said dissociating gas being directed to a region adjacent said center portion of said semiconductor wafer to enhance density of said etchant species near said center portion of said wafer relative to the density of said etchant species near said edge periphery of said wafer.

23. The method of claim 22 wherein said material etched by said etchant gas is characterized by silicon.

24. The method of claim 23 wherein said etchant gas is characterized by a mixture of chlorine gas and hydrogen bromide.

25. The method of claim 24 wherein said dissociating gas is characterized by one of: (a) xenon, and (b) argon.

* * * * *